(12) United States Patent
Yang et al.

(10) Patent No.: US 12,087,354 B2
(45) Date of Patent: Sep. 10, 2024

(54) MEMORY DEVICE

(71) Applicant: Taiwan Semiconductor Manufacturing Company, Ltd., Hsinchu (TW)

(72) Inventors: Tzu-Hsien Yang, Hsinchu (TW); Chia-En Huang, Hsinchu County (TW); Yih Wang, Hsinchu (TW); Jonathan Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 178 days.

(21) Appl. No.: 17/684,951

(22) Filed: Mar. 2, 2022

(65) Prior Publication Data

US 2023/0134975 A1 May 4, 2023

Related U.S. Application Data (60) Provisional application No. 63/275,641, filed on Nov. 4, 2021.

(51) Int. Cl.
*G11C 11/4097* (2006.01)
*G11C 11/4091* (2006.01)

(52) U.S. Cl.
CPC ...... *G11C 11/4097* (2013.01); *G11C 11/4091* (2013.01)

(58) Field of Classification Search
CPC ................ G11C 11/4097; G11C 11/4091
See application file for complete search history.

(56) References Cited

U.S. PATENT DOCUMENTS

| | | | | |
|---|---|---|---|---|
| 7,331,011 B2* | 2/2008 | Nagai | ............... | G11C 29/52 714/766 |
| 10,431,576 B1* | 10/2019 | Lu | ............... | G11C 11/418 |
| 2002/0176311 A1* | 11/2002 | Kurjanowicz | ...... | G11C 11/4087 365/230.06 |
| 2016/0163357 A1* | 6/2016 | Takahashi | ............... | G11C 5/06 365/72 |

\* cited by examiner

*Primary Examiner* — Min Huang
(74) *Attorney, Agent, or Firm* — Merchant & Gould P.C.

(57) ABSTRACT

A memory device is provided. A first sub-block of the memory device includes first memory cells arranged in a first row and connected to a first bit line and second of memory cells arranged in a second row and connected to a first complementary bit line. The first memory cells and the second memory cells are connected to word lines in a first connection pattern. A second sub-block of the memory device includes third memory cells arranged in a third row and connected to a second bit line and fourth memory cells arranged in a fourth row and connected to a complementary second bit line. The third memory cells and the fourth memory cells are connected to the word lines in a second connection pattern that is different from the first connection pattern.

20 Claims, 6 Drawing Sheets

MEMORY DEVICE

CROSS REFERENCE TO RELATED APPLICATION

This application claims the benefit of U.S. Provisional Application No. 63/275,641, filed Nov. 4, 2021, and titled "Memory Device," the disclosure of which is hereby incorporated herein by reference.

BACKGROUND

Several types of memory devices are used in processing systems or computers. One type is known as Random Access Memory (RAM). RAM is generally utilized as a main memory in processing systems. There are several types of RAM, including Static RAM (SRAM) and Dynamic RAM (DRAM). In SRAM, data is maintained as long as power is provided to it. On the other hand, DRAM is volatile, which means, it requires constant rewriting to maintain its content. DRAM is small and inexpensive and is thus used for mist system memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides a low noise memory device. For example, the disclosed memory device self-cancels coupling noise between bit lines and word lines during read or write operations thereby improving efficiency and yield. More specifically, the disclosure provides connection patterns for memory cells to the bit lines and the word lines of a memory array of a memory device to self-cancel the coupling noise between the word lines and the bit lines.

Figure 1:
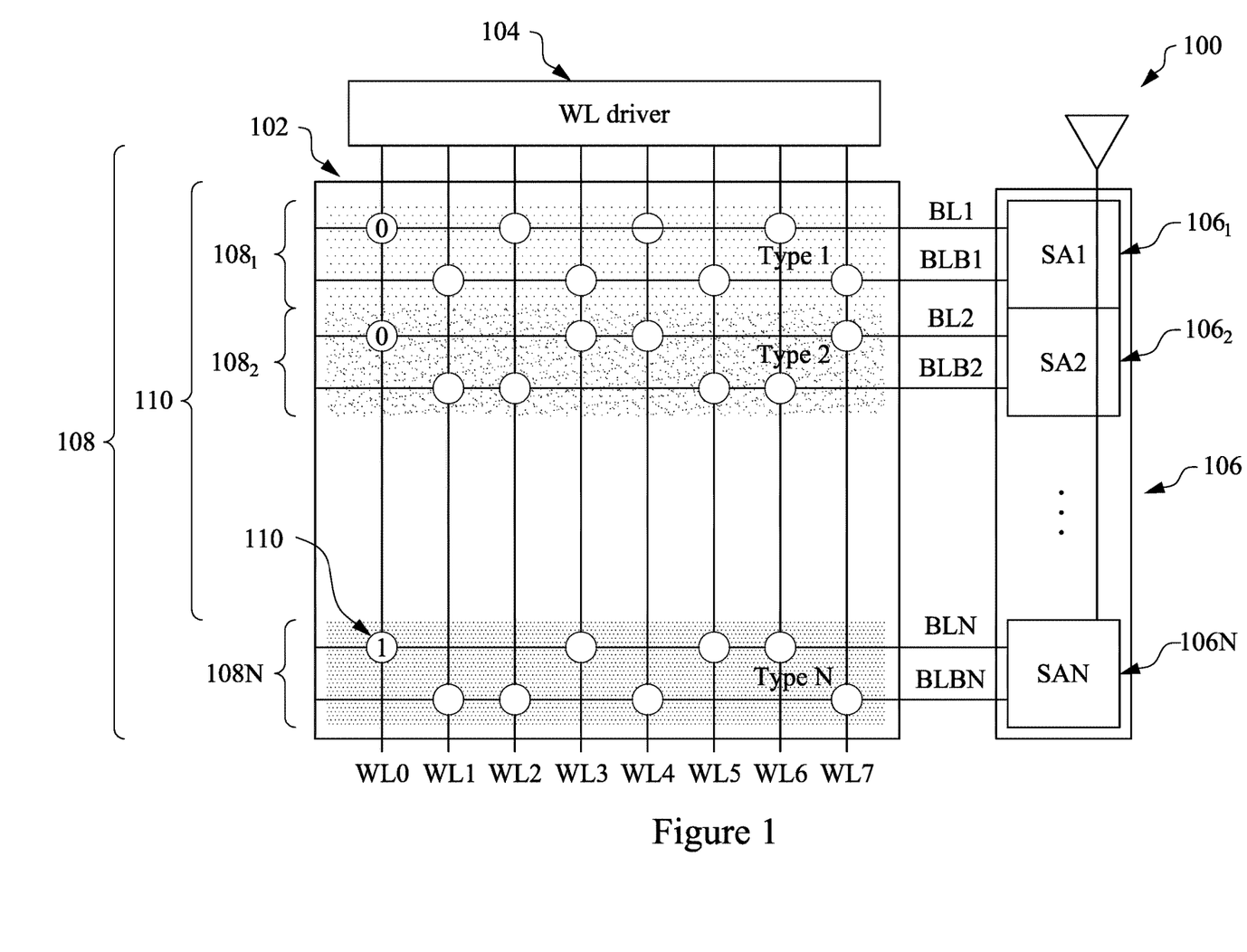
FIG. 1 is a diagram illustrating an example memory device, in accordance with some embodiments.

FIG. 1 is a block diagram of an example memory device 100 in accordance with some embodiments. In examples, memory device 100 is a Random Access Memory (RAM), such as, Dynamic RAM (DRAM). Memory device 100 includes a memory cell array 102, a word line driver 104, and a plurality of Sense Amplifiers (SAs) 106 (labeled as $106_1, 106_2, \ldots, 106_N$). In addition, memory device 100 includes a plurality of bit lines (labeled as BL1, BL2, ..., BLN), a plurality of complementary bit lines (also referred to as bit line bars) (labeled as BLB1, BLB2, ..., BLBN), and a plurality of word lines (labeled as WL0, WL1, WL2, WL3, WL4, WL5, WL6, WL7). Although only eight word lines are shown in FIG. 1, a different number of word lines is within scope of the disclosure.

Memory cell array 102 includes a plurality of memory cells (individually referred to as a memory cell 110). The plurality of memory cells are arranged in a matrix of a plurality of rows and a plurality of columns. Each row of the plurality of rows include a first plurality of memory cells and each column of the plurality of columns include a second plurality of memory cells. Each memory cell 110 in a row is connected to a corresponding bit line or a bit line bar of the plurality of bit lines and the plurality of bit line bars. In addition, each memory cell 110 in a column is connected to a word line of the plurality of word lines. Thus, each memory cell 110 of memory cell array 102 is located at an intersection of a word line and a bit line or a bit line bar. An example memory cell 110 is discussed in detail with reference to FIG. 2 of the disclosure.

Figure 2:
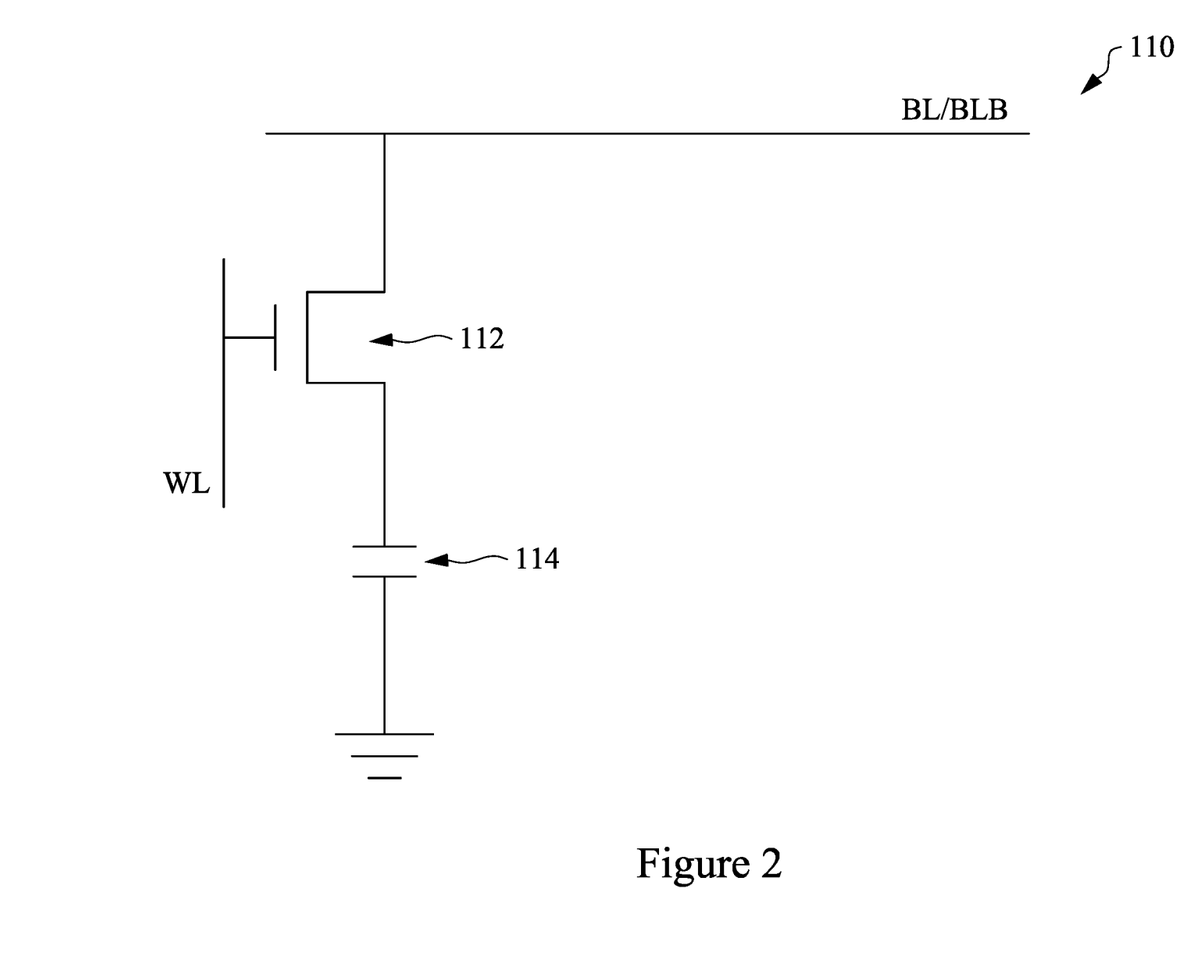
FIG. 2 is a diagram illustrating an example memory cell of a memory device, in accordance with some embodiments.

FIG. 2 illustrates memory cell 110 of memory cell array 102 in accordance with some embodiments. Memory cell 110 is operative to store one bit of information, for example, a bit value 1 and a bit value 0. As shown in FIG. 2, memory cell 110 includes an access transistor 112 and an energy storage device 114. Energy storage device 114 is also referred to as a capacitor 114. A source of access transistor 112 is connected to a bit line/bit line bar and a drain of access transistor 112 is connected to a first terminal of capacitor 114. A second terminal of capacitor 114 is connected to the ground. In some examples, the second terminal of capacitor 114 can be connected to a predetermined voltage. A gate of access transistor 112 is connected to a word line. Since access transistor 110 includes one transistor and one capacitor, it also referred to as 1T1C memory cell. However, other type of memory cells, for example, 1T2C, 1T2C, 2T1C, 3T1C, etc. are within the scope of the disclosure.

In examples, a charged capacitor 114 represents a bit value of 1 and a discharged capacitor 114 represents a bit value of 0. The word line controls access to capacitor 114 via access transistor 112. For example, the word line is charged to a predetermined voltage level to switch on access transistor 112 which connects the bit line/bit line bar to capacitor 114. The charge on capacitor 114 is measured through the bit line/bit line bar to determine the stored value.

In examples, access transistor 112 is a n-channel Metal Oxide Semiconductor (NMOS) transistor. However, other types of transistor for example, a Complementary Metal Oxide Semiconductor (CMOS) transistor, a p-channel Metal Oxide Semiconductor (PMOS) transistor, a Field Effect Transistor (FET), Metal Oxide Semiconductor Field Effect Transistor (MOSFET), etc. In addition, access transistor 112 is symmetrical. That is, a drain of access transistor 112 can be a source and a source of access transistor 112 can be a drain.

Returning to FIG. 1, in some examples, memory cell array 102 includes a folded architecture. For example, memory cell array 102 is categorized into or includes a plurality of sub-blocks, each of the plurality of sub-blocks having a bit line and a corresponding complementary bit line. One of the bit line and the corresponding complementary bit line is used as reference for a read and a write operation.

For example, the plurality of rows of memory cell array 102 are categorized into a first sub-block $108_1$, a second sub-block $108_2$, . . . , and an nth sub-block $108_N$ (together referred to as a plurality of sub-blocks 108). Each of plurality of sub-blocks 108 includes a pair of consecutive rows of memory cell array 102. For example, first sub-block $108_1$ includes a first row and a second row of memory cell array 102. Each of the first row and the second row of first sub-block $108_1$ include a first plurality of memory cells. The first plurality of memory cells of the first row are connected to a first bit line BL1 and the first plurality of memory cells of the second row are connected to a first bit line bar BLB1. The first bit line bar BLB1 is complementary to the first bit line BL1. The first bit line BL1 and the first bit line bar BLB1 are both connected to a first sense amplifier $106_1$. First sense amplifier $106_1$ (also labeled as SA1) compares the voltage level on the first bit line BL1 with the voltage level on the first bit line bar BLB1 for sensing the data stored in memory cells of first sub-block $108_1$.

In some examples, the first row of first sub-block $108_1$ includes a first plurality of memory cells and the second row of first sub-block $108_2$ includes a second plurality of memory cells. In such examples, the first plurality of memory cells of the first row are connected to the first bit line BL1 and the second plurality of memory cells of the second row are connected to the first bit line bar BLB1.

Second sub-block $108_2$ includes a third row and a fourth row of memory cell array 102. Each of the third row and the fourth row of second sub-block $108_2$ include a first plurality of memory cells. The first plurality of memory cells of the third row are connected to a second bit line BL2 and the first plurality of memory cells of the fourth row are connected to a second bit line bar BLB2. The second bit line bar BLB2 is complementary to the second bit line BL2. The second bit line BL2 and the second bit line bar BLB2 are both connected to a second sense amplifier $106_2$. Second sense amplifier $106_2$ (also labeled as SA2) compares the voltage level on the second bit line BL2 with the voltage level on the second bit line bar BLB2 to sense the data stored in memory cells of second sub-block $108_2$.

In some examples, the third row of second sub-block $108_2$ includes a third plurality of memory cells and the fourth row of second sub-block $108_2$ includes a fourth plurality of memory cells. In such examples, the third plurality of memory cells of the third row are connected to the second bit line BL2 and the fourth plurality of memory cells of the fourth row are connected to the second bit line bar BLB2.

Continuing to Nth sub-block $108_N$ that includes a (2N−1)th row and a 2Nth row of memory cell array 102. Each of the (2N−1)th row and the 2Nth row of Nth sub-block $108_N$ include a first plurality of memory cells. The first plurality of memory cells of the (2N−1)th row are connected to a Nth bit line BLN and the first plurality of memory cells of the 2Nth row are connected to an Nth bit line bar BLBN. The 2Nth bit line bar BLBN is complementary to the 2Nth bit line BLN. The 2Nth bit line BLN and the 2Nth bit line bar BLBN are both connected to a Nth sense amplifier $106_N$ (also labeled as SAN).

In examples, the first plurality of memory cells of the first row and the first plurality of memory cells of the second row of first sub-block $108_1$ are connected to the plurality of word lines according to a first connection pattern (also referred to as type 1 connection pattern). In the first connection pattern, the first plurality of memory cells of the first row and the first plurality of memory cells of the second row are connected to the plurality of word lines in an alternating pattern. For example, the first plurality of memory cells of the first row are connected to consecutive even numbered word lines and the first plurality of memory cells of the second row are connected to consecutive odd numbered word lines.

For example, and as shown in FIG. 1, in first sub-block $108_1$, a first memory cell of the first row is connected to the word line WL0, a second memory cell of the first row is connected to the word line WL2, a third memory cell of the first row is connected to the word line WL4, and a fourth memory cell of the first row is connected to the word line WL6. In addition, in first sub-block $108_1$, a first memory cell of the second row is connected to the word line WL1, a second memory cell of the second row is connected to the word line WL3, a third memory cell of the second row is connected to the word line WL5, and a fourth memory cell of the second row is connected to the word line WL7.

Figure 3:
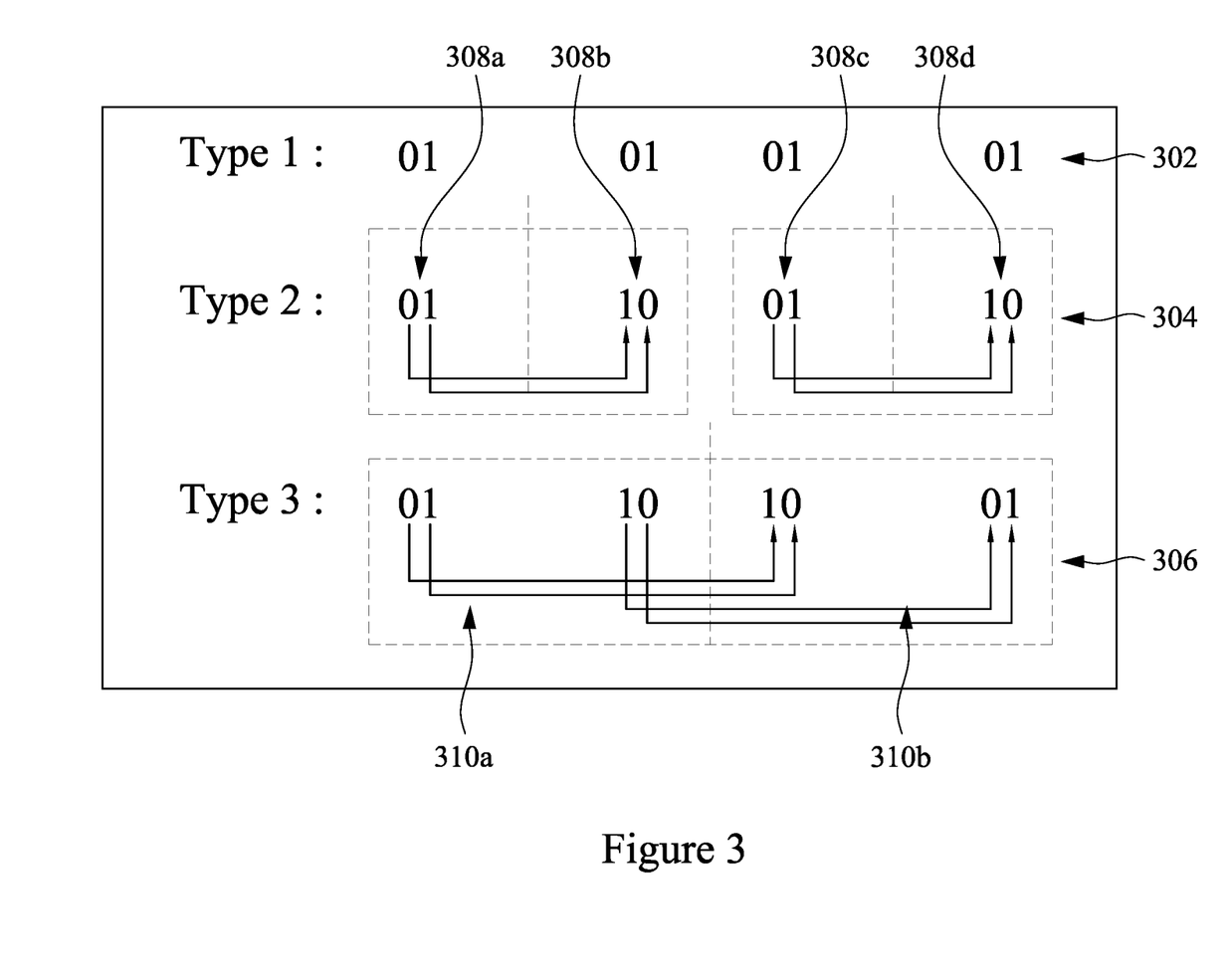
FIG. 3 is a diagram illustrating an example binary representation of a connection pattern, in accordance with some embodiments.

FIG. 3 illustrates a binary representation of connection patterns of blocks of memory cell array 102 in accordance with some example embodiments. In an example binary representation of the first connection pattern, a memory cell connected to the even numbered word line is represented by a bit 0 and a memory cell connected to the odd numbered word line is represented by a bit 1. Thus, and as shown in FIG. 3, the first connection pattern corresponding to first sub-block $108_1$ can be represented in binary as 01 01 01 01 (label 302).

In an alternative binary representation of the first connection pattern, a memory cell connected to the even numbered word line is represented by a bit 1 and a memory cell connected to the odd numbered word line is represented by a bit 0. In this alternative example, the first connection pattern can be represented in binary as 10 10 10 10. Other types of representation and other bit values for such representations are within the scope of the disclosure.

In another alternative, in the first connection pattern, the first plurality of memory cells of the first row can be connected to the consecutive odd numbered word lines and the first plurality of memory cells of the second row can be connected to the consecutive even numbered word lines. In that alternative example, the first connection pattern can be represented in binary as 01 01 01 01 when a memory cell connected to the even numbered word line is represented by bit 1 and a memory cell connected to the odd numbered word line is represented by bit 0. Moreover, in this alternative example, the first connection pattern can be represented in binary as 10 10 10 10 when a memory cell connected to the even numbered word line is represented by bit 0 and a memory cell connected to the odd numbered word line is represented by bit 1.

Returning to FIG. 1, the first plurality of memory cells of the third row and the first plurality of memory cells of the fourth row of second sub-block 108$_2$ are connected to the plurality of word lines according to a second connection pattern. The second connection pattern is different from the first connection pattern. In some examples, the second connection pattern is semi-complementary to the first connection pattern. For example, in the second connection pattern, a first portion of the first plurality of memory cells of the third row and the first plurality of memory cells of the fourth row of second sub-block 108$_2$ are connected to the plurality of word lines in a same pattern as that of the first connection pattern. In such examples, a second portion or the remaining of the first plurality of memory cells of the third row and the first plurality of memory cells of the fourth row of second sub-block 108$_2$ are connected to the plurality of word lines complementing the first portion. In other examples, in the second connection pattern, one half of the first plurality of memory cells of the third row and the first plurality of memory cells of the fourth row of second sub-block 108$_2$ are connected to the plurality of word lines in a same pattern as that of the first connection pattern and the other half are connected to the plurality of word lines complementing the first half.

For example, and as shown in FIG. 1, in sub-second block 108$_2$, a first memory cell of the first row is connected to the word line WL0, a second memory cell of the first row is connected to the word line WL3, a third memory cell of the first row is connected to the word line WL4, and a fourth memory cell of the first row is connected to the word line WL7. In addition, in second sub-block 108$_2$, a first memory cell of the second row is connected to the word line WL1, a second memory cell of the second row is connected to the word line WL2, a third memory cell of the second row is connected to the word line WL5, and a fourth memory cell of the second row is connected to the word line WL6. As shown in FIG. 3, the second connection pattern can be represented in binary as 01 10 01 10 (label 304) when a memory cell connected to the even numbered word line is represented by bit 0 and a memory cell connected to the odd numbered word line is represented by bit 1. Moreover, a third connection pattern (also referred to as type 3 connection pattern) corresponding to a third sub-block (not shown) can be presented as 01 10 10 01 (label 306).

In addition, and as shown in the binary representations of the first connection pattern and the second connection pattern in FIG. 3, are semi-complementary. In an example, in the semi-complementary connection pattern, half of the memory cells of are connected according to the first connection pattern and the other half of the memory cells are connected in a connection pattern that is complementary to the first connection pattern. For example, and as shown in FIG. 3, in the second connection pattern (label 304), the first two memory cells (label 308$a$) are connected in a same pattern as first two memory cells of the first connection pattern. Next two memory cells (label 308$b$) in the second connection pattern are connected complementing the first connection pattern of the first two memory cells. Continuing on, next two memory cells (label 308$c$) in the second connection pattern are connected in a same pattern as first two memory cells of the first connection pattern and next two memory cells (label 308$d$) in the second connection pattern are connected complementing the first connection pattern of the first two memory cells. Similarly, and as shown in FIG. 3 in the third connection pattern, one half (label 310$a$) of the first plurality of memory cells of a fifth row and the first plurality of memory cells of the sixth row of a third sub-block are connected to the plurality of word lines is a same pattern as that of the second connection pattern and the other half (label 310$b$) are connected to the plurality of word lines complementing the first half. In examples, one half of the memory cells being semi-complementary of the other half of the memory cells is exemplary in nature and other fractions are within the scope of the disclosure. For example, the second connection pattern may include ⅔ of the memory cells connected in a same pattern as the first connection pattern and the remaining ⅓ of the memory cells complementing the first connection pattern. In another example, the second connection pattern may include ⅓ of the memory cells connected in a same pattern as the first connection pattern and the remaining ⅔ of the memory cells complementing the first connection pattern.

Returning to FIG. 1, the first plurality of memory cells of the (2N−1)th row and the first plurality of memory cells of the 2Nth row of Nth sub-block 108$_N$ are connected to the plurality of word lines according to an Nth connection pattern (also referred to as a type N connection pattern). The Nth connection pattern is semi-complementary to an (N−1)th connection pattern. For example, and as shown in FIG. 1, in Nth sub-second block 108$_N$, a first memory cell of the (2N−1)th row is connected to the word line WL0, a second memory cell of the (2N−1)th row is connected to the word line WL3, a third memory cell of the (2N−1)th row is connected to the word line WL5, and a fourth memory cell of the (2N−1)th row is connected to the word line WL6. In addition, a first memory cell of the 2Nth row is connected to the word line WL1, a second memory cell of the 2Nth row is connected to the word line WL2, a third memory cell of the 2Nth row is connected to the word line WL4, and a fourth memory cell of the 2Nth row is connected to the word line WL7. The Nth connection pattern can be represented in binary as 01 10 10 01 when a memory cell connected to the even numbered word line is represented by bit 0 and a memory cell connected to the odd numbered word line is represented by bit 1.

In examples, the second connection pattern is generated by connecting one half of the memory cells of second sub-block 108$_2$ according of the first connection pattern and connecting the other half of the memory cells complementing the first connection pattern. Similarly, the third connection pattern is generated by connecting one half of the memory cells of a third sub-block according of the second connection pattern and connecting the other half of the memory cells complementing the second connection pattern. This can continue to the Nth connection pattern which can be generated by connecting one half of the memory cells of Nth sub-block 108$_N$ according of the (N−1)th connection pattern and connecting the other half of the memory cells complementing the (N−1)th connection pattern.

Referring to FIG. 1, word line driver 104 is operative to receive an address, decode the address to select a word line of the plurality of word lines, and charge the selected word line to a predetermined voltage for a read or a write operation in memory cell array 102. Data read from memory cell array 102 is sensed by plurality of sense amplifiers 106. In examples, each of plurality of sense amplifiers 106 is a differential sense amplifier. That is, each of plurality of sense amplifiers 106 operate by receiving a small differential voltage between the corresponding bit line and the bit line bar. The small differential voltage between the corresponding bit line and the bit line bar is sensed by corresponding plurality of sense amplifiers 106 and is then amplified to a larger voltage.

Figure 4:
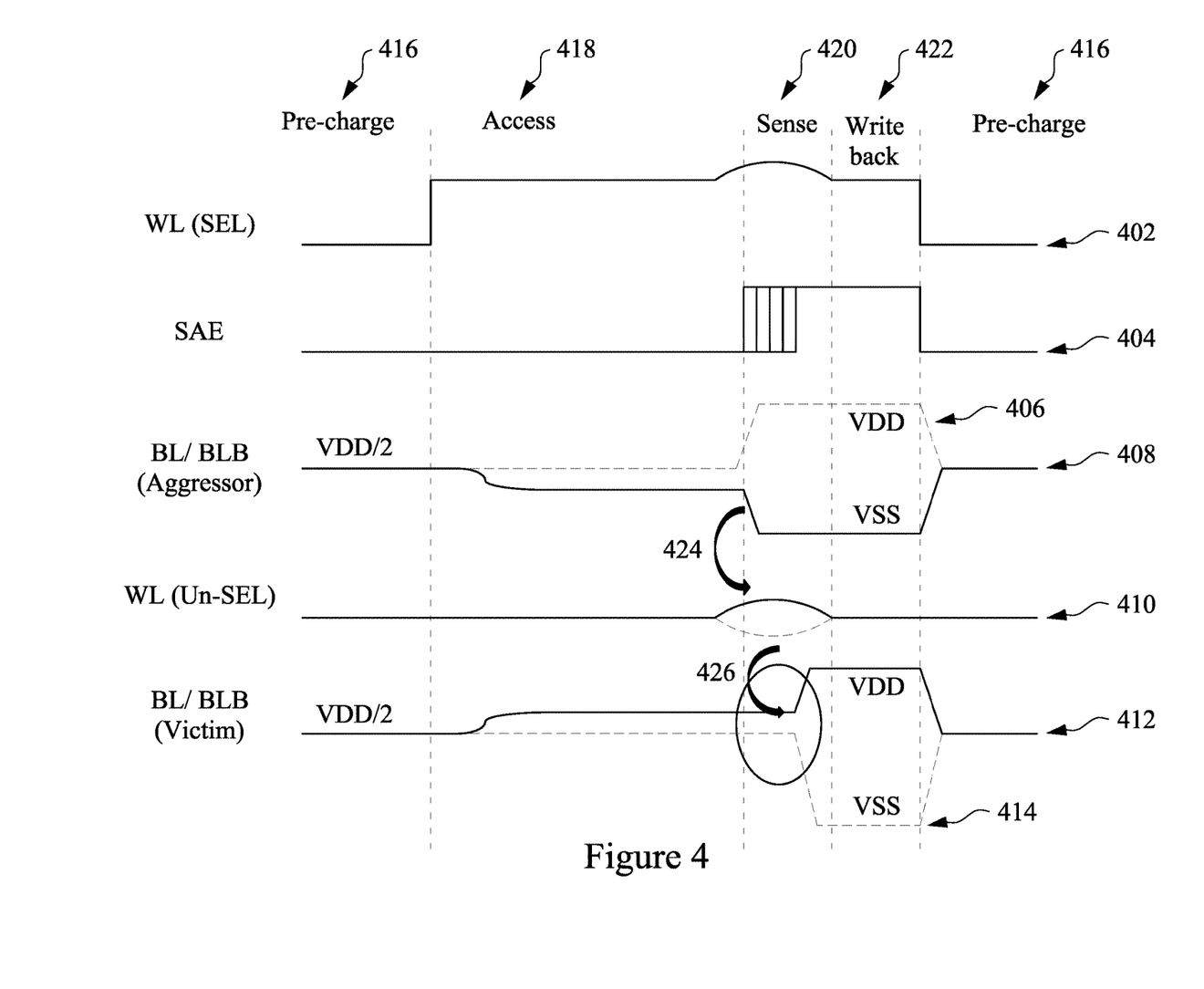
FIG. 4 is a diagram illustrating voltage levels during a read operation on a memory device, in accordance with some embodiments.

FIG. 4 illustrates voltage levels of memory device 100 during an example read operation. More specifically, FIG. 4 illustrates the voltage levels during reading of a bit value 1 from memory cell 110 of (2N−1)th row of Nth sub-block $108_N$ of memory cell array 102 of memory device 100. Since, the bit value of 1 is being read from memory cell 110 of Nth sub-block $108_N$ of memory cell array 102, Nth sub-block $108_N$ of memory cell array 102 is referred to as a victim sub-block and other sub-blocks or remaining sub-blocks of memory cell array 102 are referred to as aggressor sub-blocks for this example read operation. The bit line and the bit line bar associated with the victim sub-block are referred to as a victim bit line and a victim bit line bar respectively. For example, the bit line BLN of Nth sub-block $108_N$ is referred to as the victim bit line and the bit line bar BLBN of Nth sub-block $108_N$ is referred to as the victim bit line bar. In addition, the bit line and the bit line bar associated with an aggressor sub-block are referred to as an aggressor bit lines and an aggressor bit line bar respectively. For example, the bit line BL1 of first sub-block $108_1$ and the bit line BL2 of second sub-block $108_2$ are referred to as the aggressor bit lines and the bit line bare BLB1 of first sub-block $108_1$ and the bit line bar BLB2 of second sub-block $108_2$ are referred to as the aggressor bit line bars.

In FIG. 4, a first plot 402 represents a voltage level of a selected word line, a second plot 404 represents a voltage level of an output of a sense amplifier, a third plot 406 represents a voltage level of an aggressor bit line bar BLB, a fourth plot 408 represents a voltage level of an aggress bit line BL, a fifth plot 410 represents a voltage level of an unselected word line, a sixth plot 412 represents a voltage level of a victim bit line BL, and a seventh plot 414 represents a voltage level of a victim bit line bar BLB. In addition, and as shown in FIG. 4, the example read operation includes a plurality of states, for example, a pre-charge state 416, an access state 418, a sense state 420, and a write back state 422.

Before beginning of the read operation, memory device 100 is in pre-charge state 416. In pre-charge state 416, the voltage levels on the selected word line and the unselected word lines, as shown in first plot 402 and fifth plot 410, are at a pre-charge voltage level (for example, approximately −0.4 volts). However other voltages are possible. For example, the pre-charge voltage level for the word lines can be 0 volt. In some examples, the pre-charge voltage level for the word lines is also referred to as a pre-determined voltage level or a word line voltage level.

In addition, during pre-charge state 416, both the aggressor bit line and the aggressor bit line bar, as shown in third plot 406 and fourth plot 408, are pre-charged and equilibrated to a common intermediate voltage (for example, VDD/2 where VDD refers to a supply voltage). In some examples, the supply voltage can be 0.75 volt. However other voltages are possible. Moreover, both the victim bit line and the victim bit line bar, as shown in sixth plot 412 and seventh plot 414, are also at the common intermediate voltage level (that is, VDD/2). However, the victim bit line and the victim bit line bar can be at a different common intermediate voltage level than that of the aggressor bit line and the aggressor bit line bar. In addition, during pre-charge state 416, the voltage level of an output of a sense amplifier in pre-charge state 416, as shown in second plot 404, is at voltage zero.

Memory device 100 transitions from pre-charge state 416 to access state 418. For example, word line driver 104 decodes an address to select a word line of memory device 100 (for example, the word line WL0) and charges the selected word line to a read word line voltage. In some examples, the read word line voltage is 1.5 volts. However, other voltages are possible. As shown in first plot 402, the voltage level on a selected word line rises to 1.5 volts in access state 418 from −0.4 volt of pre-charge state 416.

Charging the selected word line to the read word line voltage results in switching on access transistor 112 of memory cell 110, which in turn results in the bit line being connected to capacitor 114 of memory cell 110. For example, the bit line BLN is connected to capacitor 114 of memory cell 110. This in turn results in change in the voltage level on the victim bit line. For example, and as shown in sixth plot 412, the victim bit line is pulled up from the common intermediate voltage level of pre-charge state 416. In addition, and as shown in fourth plot 408, the voltage level of an aggressor bit line is pulled down from the common intermediate voltage level of pre-charge state 416.

From access state 418, the read operation transitions to sense state 420. In sense state, sense amplifier $106_N$, compares the voltage level on the victim bit line (that is, bit line BLN) with the voltage level of the victim bit line bar (that is, the bit line bar BLN) and provides an output based on the comparison. As shown in third plot 406, the aggressor bit line is pulled to a predetermined positive voltage (for example, VDD) and, as shown in fourth plot 408, the aggressor bit line bar is pulled down to a predetermined negative voltage (for example, VSS). This causes, as indicated by bumps in first plot 402 and fifth plot 410, a coupling noise between the bit line/the bit line bar and the word lines. However, and as shown in fifth plot 410, the coupling noise in the unselected word line is reduced or canceled out (arrow 424). For example, in the first connection pattern, the positive coupling noise caused by the bit line is approximately equal to the negative coupling noise caused by the bit line bar, thereby resulting in self-cancelation of the overall coupling noise. Therefore, and as indicated by arrow 426, the self-cancelation of the coupling noise maintains a voltage difference in the victim bit line and the victim bit line bar during the read operation. As shown in second plot 404, the voltage level of the output of the sense amplifier rises to a predetermined value indicating a bit value of 1 being read during the read operation.

From sense state 420, the read operation transitions to write back state 422. In write back state 422, the bit value read during sense state 420 is written back to memory cell 110 of Nth sub-block $108_N$ of memory cell array 102. For writing the data back, and as shown in sixth plot 412, the victim bit line is pulled up to the predetermined positive voltage (for example, the VDD) and, as shown in the seventh plot 414, the victim bit line bar is pulled down to a predetermined negative voltage (for example, VSS). After write back state 422, the read operation transitions to pre-charge state 416.

Thus, the above described connection patterns result in self-cancelation of coupling noise between the bit line lines and the word lines of memory device 100. This in turn results in improved voltage difference between the bit line and the bit line bar for the read operation, thereby improving efficiency and yield of memory device 100.

Figure 5A:
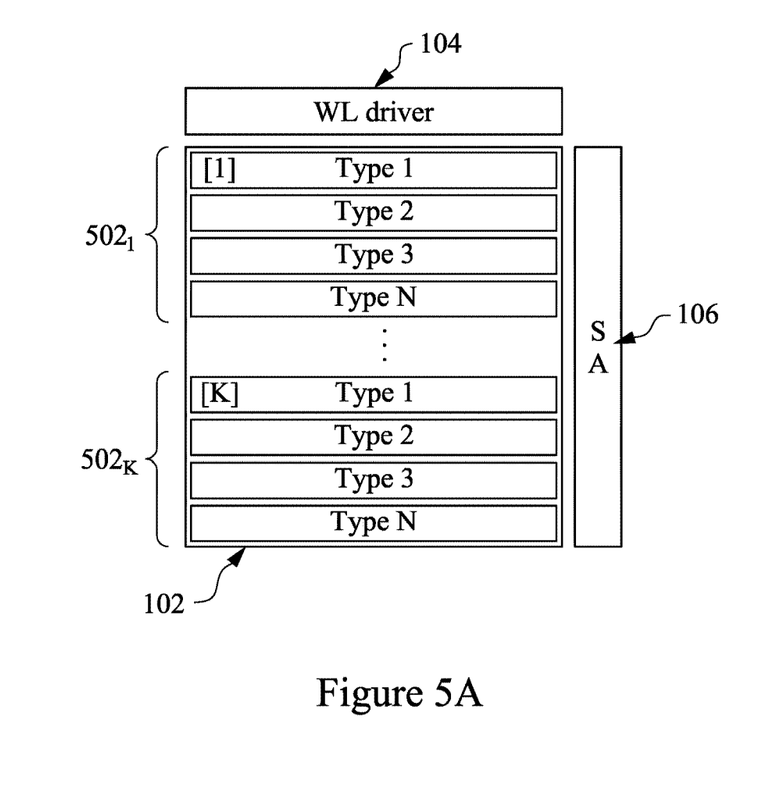
FIG. 5A is a diagram illustrating a first example arrangement of memory cells in a memory device, in accordance with some embodiments.

In examples, memory cells of memory device 100 can be organized or arranged based on the connection patterns of the sub-blocks. FIG. 5A illustrates a first example arrangement 500 of the memory cells of memory device 100. As shown in first example arrangement 500, the memory cells of memory cell array 102 can be organized into a plurality of mini memory cell arrays (for example, a $1^{th}$ mini-memory cell array $502_0$, . . . , $K^{th}$ mini-memory cell array $502_k$). Each of the plurality of mini-memory cell arrays include a plurality of sub-blocks arranged according to an increasing connection pattern type. For example, and as shown in FIG. 5A, each of $1^{th}$ mini-memory cell array $502_1$, . . . , $K^{th}$ mini-memory cell array $502_k$, includes a first sub-block of the type 1 connection pattern, a second sub-block of the type 2 connection pattern, a third sub-block of the type 3 connection pattern, . . . continuing (N)th sub-block of the type N connection pattern. In some examples, the sub-blocks can be arranged in a decreasing connection pattern type. For example, each of $1^{th}$ mini-memory cell array $502_1$, . . . , $K^{th}$ mini-memory cell array $502_k$ can include a first sub-block of the type N connection pattern, a second sub-block of the type (N−1) connection pattern, a third sub-block of the type (N−2) connection pattern, . . . continuing $N^{th}$ sub-block of the type 1 connection pattern. Other arrangements with different arrangement of the connection pattern types are within the scope of the disclosure.

Figure 5B:
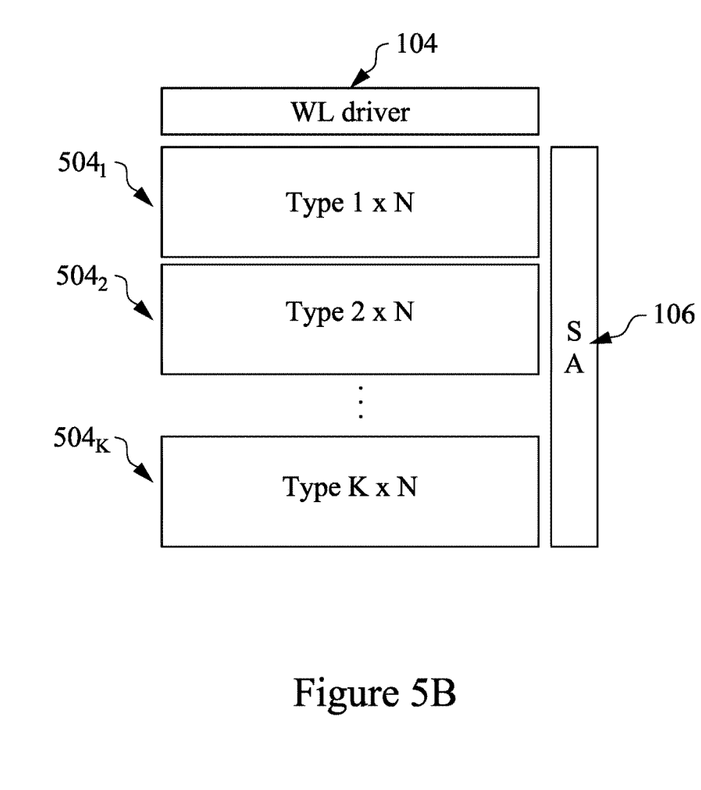
FIG. 5B is a diagram illustrating a second example arrangement of memory cells in a memory device, in accordance with some embodiments.

For example, FIG. 5B illustrates a second example arrangement 550 of the memory cells of memory device 100. As shown in second example arrangement 550, the memory cells of memory cell array 102 can also be organized into a plurality of mini memory cell arrays (that is, a $1^{th}$ mini-memory cell array $504_1$, . . . , $K^{th}$ mini-memory cell array $504_k$). Each of the plurality of mini-memory cell arrays include a plurality of sub-blocks of a same connection pattern type. For example, and as shown in FIG. 5B, $1^{th}$ mini-memory cell array $504_1$ includes a plurality of sub-blocks of the type 1 connection pattern. Similarly, and as shown in FIG. 5B, $2^{nd}$ mini-memory cell array $504_2$ includes a plurality of sub-blocks of the type 2 connection pattern, continuing $K^{th}$ mini-memory cell array $504_k$ which includes a plurality of sub-blocks of a type K connection pattern.

In examples, different other type of connection patterns can be generated from existing connection patterns. For example, a first different type of connection pattern can be generated by swapping the word line connections for the memory cells associated with the bit line and the bit line bars. That is, the memory cells connected to the bit lines and first word lines can be swapped to the bit line bars and the first word lines and the memory cells connected to the bit line bars and second word lines can be swapped to the bit lines and the second word lines.

In another example, a second different type of connection pattern can be generated by re-arranging the word lines. For example, the even numbered word lines for the connection type 0 can be grouped together to form a second type of connection pattern. Similarly, the odd numbered word lines for the connection type 0 can be grouped together to form a third type of connection pattern. Such other type of connection patterns generated by rearranging the word lines are within the scope of the disclosure.

Figure 6:
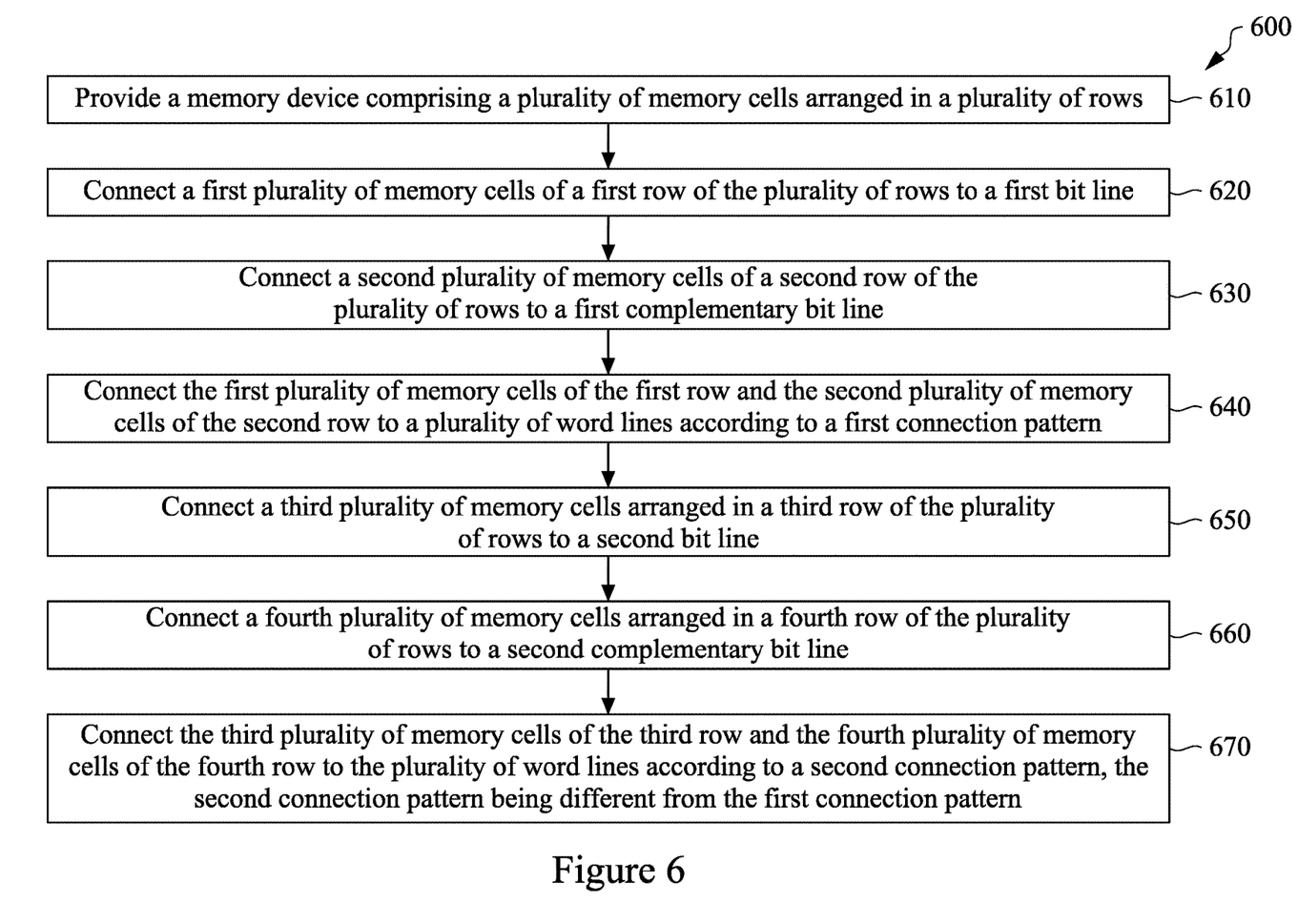
FIG. 6 is a flow diagram illustrating a method of connecting memory cells of a memory device, in accordance with some embodiments.

FIG. 6 is a flow diagram illustrating a method 600 for connecting memory cells of cell array 102 of memory device 100 in accordance with some embodiments. It will be apparent to a person skill in the art after reading this disclosure that other methods for connecting the memory cells of cell array 102 of memory device 100 are possible.

At block 610 of method 600, a memory device 100 having a plurality of memory cells arranged in a plurality of rows is provided. At block 620 of method 600, a first plurality of memory cells arranged in a first row of the plurality of rows are connected to a first bit line. For example, the first plurality of memory cells of the first row are connected to the first bit line BL1. In some examples, the source/drain of access transistor 112 of each of the first plurality of memory cells of the first row are connected to the first bit line BL1.

At block 630 of method 600, a second plurality of memory cells arranged in a first row of the plurality of rows are connected to a first complementary bit line. For example, the second plurality of memory cells of the second row are connected to the first bit line bar BLB1. In some examples, the source/drain of access transistor 112 of each of the second plurality of memory cells of the second row are connected to the first bit line bar BLB1.

At block 640 of method 600, the first plurality of memory cells of the first row and the second plurality of memory cells of the second row are connected to a plurality of word lines according to a first connection pattern. For example, and as shown in FIG. 1, a first memory cell of the first row is connected to the word line WL0, a second memory cell of the first row is connected to the word line WL2, a third memory cell of the first row is connected to the word line WL4, and a fourth memory cell of the first row is connected to the word line WL6. In addition, a first memory cell of the second row is connected to the word line WL1, a second memory cell of the second row is connected to the word line WL3, a third memory cell of the second row is connected to the word line WL5, and a fourth memory cell of the second row is connected to the word line WL7.

At block 650 of method 600, a third plurality of memory cells arranged in a third row of the plurality of rows are connected to a second bit line. For example, the third plurality of memory cells of the third row are connected to the second bit line BL2. In some examples, the source/drain of access transistor 112 of each of the third plurality of memory cells of the third row are connected to the first bit line BL2.

At block 660 of method 600, a fourth plurality of memory cells arranged in a fourth row of the plurality of rows are connected to a second complementary bit line. For example, the fourth plurality of memory cells of the fourth row are connected to the second bit line bar BLB2. In some examples, the source/drain of access transistor 112 of each of the fourth plurality of memory cells of the fourth row are connected to the second bit line bar BLB2.

At block 670 of method 600, the third plurality of memory cells of the third row and the fourth plurality of memory cells of the fourth row are connected to the plurality of word lines according to a second connection pattern. For example, and as shown in FIG. 1, a first memory cell of the first row is connected to the word line WL0, a second memory cell of the first row is connected to the word line WL3, a third memory cell of the first row is connected to the word line WL4, and a fourth memory cell of the first row is connected to the word line WL7. In addition, in sub-second block $108_2$, a first memory cell of the second row is connected to the word line WL1, a second memory cell of the second row is connected to the word line WL2, a third memory cell of the second row is connected to the word line WL5, and a fourth memory cell of the second row is connected to the word line WL6. In examples, the second connection pattern is different from the first connection pattern. In some examples, the second connection pattern is semi-complementary to the first connection pattern.

In accordance with example embodiments, a memory device comprises: a first sub-block comprising: a first plurality of memory cells arranged in a first row and connected to a first bit line, and a second plurality of memory cells arranged in a second row and connected to a first complementary bit line, wherein the first plurality of memory cells of the first row and the second plurality of memory cells of the second row are connected to a plurality of word lines in a first connection pattern; and a second sub-block comprising: a third plurality of memory cells arranged in a third row and connected to a second bit line, and a fourth plurality of memory cells arranged in a fourth row and connected to a complementary second bit line, wherein the third plurality of memory cells of the third row and the fourth plurality of memory cells of the fourth row are connected to the plurality of word lines in a second connection pattern, the second connection pattern being different from the first connection pattern.

In example embodiments, a memory device comprises: a first sub-block comprising: a first bit line, a second bit line, a first plurality of memory cells connected to the first bit line, wherein each of the first plurality of memory cells are arranged in a first row, and a second plurality of memory cells connected to the second bit line, wherein each of the second plurality of memory cells are arranged in a second row; a second sub-block comprising: a third bit line, a fourth bit line, a third plurality of memory cells connected to the third bit line, wherein each of the third plurality of memory cells are arranged in a third row, and a fourth plurality of memory cells connected to the fourth bit line, wherein each of the fourth plurality of memory cells are arranged in a fourth row; and a plurality of word lines, and wherein: the first plurality of memory cells and the second plurality of memory cells are connected to the plurality of word lines in a first pattern, and third plurality of memory cells and the fourth plurality of memory cells are connected the plurality of word lines in a second pattern, wherein the second pattern is different than the first pattern.

In accordance with example embodiments, a method of connecting memory cells in a memory device, comprises: providing a memory device comprising a plurality of memory cells arranged in a plurality of rows; connecting a first plurality of memory cells arranged in a first row of the plurality of rows to a first bit line; connecting a second plurality of memory cells arranged in a second row of the plurality of rows to a first complementary bit line; connecting the first plurality of memory cells of the first row and the second plurality of memory cells of the second row to a plurality of word lines according to a first connection pattern; connecting a third plurality of memory cells arranged in a third row of the plurality of rows to a second bit line; connecting a fourth plurality of memory cells arranged in a fourth row of the plurality of rows to a second complementary bit line; and connecting the third plurality of memory cells of the third row and the fourth plurality of memory cells of the fourth row to the plurality of word lines according to a second connection pattern, the second connection pattern being different from the first connection pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a first sub-block comprising:
      a first plurality of memory cells arranged in a first row and connected to a first bit line, and
      a second plurality of memory cells arranged in a second row and connected to a first complementary bit line, wherein the first plurality of memory cells of the first row and the second plurality of memory cells of the second row are connected to a plurality of word lines in a first connection pattern; and
   a second sub-block comprising:
      a third plurality of memory cells arranged in a third row and connected to a second bit line, and
      a fourth plurality of memory cells arranged in a fourth row and connected to a second complementary bit line, wherein the third plurality of memory cells of the third row and the fourth plurality of memory cells of the fourth row are connected to the plurality of word lines in a second connection pattern, the second connection pattern being semi-complementary to the first connection pattern.

2. The memory device of claim 1, wherein in the first connection pattern the first plurality of memory cells and the second plurality of memory cells are connected to the plurality of word lines in an alternating pattern.

3. The memory device of claim 1, wherein in the first connection pattern the first plurality of memory cells are connected to consecutive even numbered word lines of the plurality of word lines and the second plurality of memory cells are connected to consecutive odd numbered word lines of the plurality of word lines.

4. The memory device of claim 1, wherein in the first connection pattern the first plurality of memory devices are connected to consecutive odd numbered word lines of the plurality of word lines and the second plurality of memory cells are connected to consecutive even numbered word lines of the plurality of word lines.

5. The memory device of claim 1, wherein in the second connection pattern a first portion of the third plurality of memory cells of the third row and the fourth plurality of memory cells of the fourth row of second sub-block are connected to the plurality of word lines in a same pattern as that of the first connection pattern and a second portion of the third plurality of memory cells of the third row and the fourth plurality of memory cells of the fourth row of second sub-block are connected to the plurality of word lines complementing the first portion.

6. The memory device of claim 1, wherein a first half of the third plurality of memory cells of the third row and the fourth plurality of memory cells of the fourth row of second sub-block are connected to the plurality of word lines in a same pattern as that of the first connection pattern and a second half of the third plurality of memory cells of the third row and the fourth plurality of memory cells of the fourth row of second sub-block are connected to the plurality of word lines complementing the first half.

7. The memory device of claim 1, further comprising a third sub-block comprising:
   a fifth plurality of memory cells arranged in a fifth row and connected to a third bit line, and a sixth plurality of memory cells arranged in a sixth row and connected to a third complementary bit line, wherein the fifth plurality of memory cells of the fifth row and the sixth plurality of memory cells of the sixth row are connected to the plurality of word lines in a third connection pattern, wherein the third connection pattern is different from both the first connection pattern and the second connection pattern.

8. The memory device of claim 7, wherein the third connection pattern is semi-complementary to the second connection pattern.

9. A memory device comprising:
a first sub-block comprising:
a first bit line,
a second bit line,
a first plurality of memory cells connected to the first bit line, wherein each of the first plurality of memory cells are arranged in a first row, and
a second plurality of memory cells connected to the second bit line, wherein each of the second plurality of memory cells are arranged in a second row;
a second sub-block comprising:
a third bit line,
a fourth bit line,
a third plurality of memory cells connected to the third bit line, wherein each of the third plurality of memory cells are arranged in a third row, and
a fourth plurality of memory cells connected to the fourth bit line, wherein each of the fourth plurality of memory cells are arranged in a fourth row; and
a plurality of word lines, wherein:
the first plurality of memory cells and the second plurality of memory cells are connected to the plurality of word lines in a first pattern, and
third plurality of memory cells and the fourth plurality of memory cells are connected the plurality of word lines in a second pattern, wherein the second pattern is semi-complementary to the first pattern.

10. The memory device of claim 9, wherein the second bit line is complementary to the first bit line, and wherein the fourth bit line is complementary to the third bit line.

11. The memory device of claim 9, further comprising:
a first sense amplifier connected to both the first bit line and the second bit line; and
a second sense amplifier connected to both the third bit line and the fourth bit line.

12. The memory device of claim 9, wherein in the first pattern the first plurality of memory cells are connected to a consecutive odd numbered word line of the plurality of word lines and the second plurality of memory cells are connected to a consecutive even numbered word line of the plurality of word lines.

13. The memory device of claim 9, further comprising a plurality of mini arrays each comprising a plurality of sub-blocks arranged according a connection pattern type.

14. The memory device of claim 9, further comprising a plurality of mini arrays each comprising a plurality of sub-blocks of a same connection pattern type.

15. A method of connecting memory cells in a memory device, the method comprising:
providing a memory device comprising a plurality of memory cells arranged in a plurality of rows;
connecting a first plurality of memory cells arranged in a first row of the plurality of rows to a first bit line;
connecting a second plurality of memory cells arranged in a second row of the plurality of rows to a first complementary bit line;
connecting the first plurality of memory cells of the first row and the second plurality of memory cells of the second row to a plurality of word lines according to a first connection pattern;
connecting a third plurality of memory cells arranged in a third row of the plurality of rows to a second bit line;
connecting a fourth plurality of memory cells arranged in a fourth row of the plurality of rows to a second complementary bit line; and
connecting the third plurality of memory cells of the third row and the fourth plurality of memory cells of the fourth row to the plurality of word lines according to a second connection pattern, the second connection pattern being semi-complementary to the first connection pattern.

16. The method of claim 15, wherein connecting the first plurality of memory cells of the first row and the second plurality of memory cells of the second row to the plurality of word lines according to the first connection pattern comprises:
connecting the first plurality of memory cells of the first row to consecutive even numbered word lines of the plurality of word lines; and
connecting the second plurality of memory cells of the second row to consecutive odd numbered word lines of the plurality of word lines.

17. The method of claim 15, further comprising generating a third connection pattern from the first connection pattern.

18. The method of claim 15, further comprising re-arranging the plurality of rows based on a connection pattern type.

19. The memory device of claim 9, further comprising a third sub-block comprising:
a fifth plurality of memory cells arranged in a fifth row and connected to a fifth bit line, and
a sixth plurality of memory cells arranged in a sixth row and connected to a sixth bit line, wherein the fifth plurality of memory cells of the fifth row and the sixth plurality of memory cells of the sixth row are connected to the plurality of word lines in a third pattern, wherein the third pattern is different from both the first pattern and the second pattern.

20. The memory device of claim 19, wherein the third pattern is semi-complementary to the second pattern.

* * * * *